(12) United States Patent
Okamoto

(10) Patent No.: US 6,891,269 B1
(45) Date of Patent: May 10, 2005

(54) EMBEDDED ELECTROCONDUCTIVE LAYER STRUCTURE

(75) Inventor: Shigeru Okamoto, Kanagawa (JP)

(73) Assignee: Fujitsu LImited, Kawasaki (JP)

( * ) Notice: Subject to any disclaimer, the term of this patent is extended or adjusted under 35 U.S.C. 154(b) by 0 days.

(21) Appl. No.: 09/521,389

(22) Filed: Mar. 8, 2000

Related U.S. Application Data

(62) Division of application No. 08/959,763, filed on Oct. 29, 1997, now Pat. No. 6,090,702, which is a division of application No. 08/660,524, filed on Jun. 7, 1996, now Pat. No. 5,736,192.

(30) Foreign Application Priority Data

Jul. 5, 1995 (JP) .............................................. 7-169537
Feb. 27, 1996 (JP) .............................................. 8-39495

(51) Int. Cl.$^7$ .............................................. H01L 23/48
(52) U.S. Cl. ....................... 257/753; 257/751; 257/758; 257/767; 257/774
(58) Field of Search ................................ 257/751, 753, 257/758, 767, 774, E23.011, E23.145, E21.584; 438/627, 628, 622, 643, 644, 637, 653, 656, 687, 688, 720

(56) References Cited

U.S. PATENT DOCUMENTS

| 4,910,169 A | * | 3/1990 | Hoshino ...................... 438/660 |
| 4,990,997 A | * | 2/1991 | Nishida ....................... 257/751 |
| 5,070,036 A | * | 12/1991 | Stevens ....................... 438/627 |
| 5,227,335 A | | 7/1993 | Holschwandner et al. .. 437/192 |
| 5,232,872 A | | 8/1993 | Ohba ....................... 427/255.2 |
| 5,290,733 A | | 3/1994 | Hayasaka et al. ........... 437/194 |
| 5,378,660 A | | 1/1995 | Ngan et al. .................. 437/247 |
| 5,393,565 A | | 2/1995 | Suzuki et al. ............... 438/648 |
| 5,407,698 A | | 4/1995 | Emesh ......................... 427/99 |
| 5,429,989 A | | 7/1995 | Fiordalice et al. .......... 437/190 |
| 5,464,666 A | | 11/1995 | Fine et al. ................... 427/576 |
| 5,489,548 A | | 2/1996 | Nishioka et al. .............. 437/60 |
| 5,552,341 A | * | 9/1996 | Lee ............................. 438/643 |
| 5,612,254 A | * | 3/1997 | Mu et al. ..................... 438/634 |
| 5,614,756 A | | 3/1997 | Forouhi et al. ............. 257/530 |
| 5,627,102 A | | 5/1997 | Shinriki et al. ............. 437/192 |
| 5,641,985 A | | 6/1997 | Tamura et al. .............. 257/530 |
| 5,652,464 A | * | 7/1997 | Liao et al. ................... 257/751 |
| 5,739,579 A | * | 4/1998 | Chiang et al. .............. 257/635 |
| 5,759,915 A | | 6/1998 | Matsunaga et al. ......... 438/627 |
| 5,793,057 A | | 8/1998 | Summerfelt ................... 257/55 |
| 5,801,095 A | | 9/1998 | Huang et al. ............... 438/627 |
| 5,801,098 A | | 9/1998 | Fiordalice et al. .......... 438/653 |
| 5,903,053 A | | 5/1999 | Iijima et al. ................. 257/751 |
| 5,998,870 A | | 12/1999 | Lee et al. .................... 257/751 |

FOREIGN PATENT DOCUMENTS

| JP | 03-278431 | 12/1991 |
| JP | 06-61229 | 3/1994 |

OTHER PUBLICATIONS

John A.T. Norman, David A. Roberts et al., Enhanced Deposition of Copper Films by CVD—Advanced Metalization for ULSI Application pp. 57–62.

Susan L. Cohen, Michael Liehr and Srinandan Kasi, Mechanisms of copper chemical vapor depositions, Appl. Phys. Lett. 60 (1), Jan. 6, 1992, pp. 50–52.

* cited by examiner

Primary Examiner—George Fourson
Assistant Examiner—Julio J. Maldonado
(74) Attorney, Agent, or Firm—Greer, Burns & Crain, Ltd

(57) ABSTRACT

An embedded electroconductive layer is disclosed which comprises an opening part or a depressed part 3 formed in an insulating film 2 on a substrate 1, a barrier layer for covering the opening part or the depressed part, a metal growth promoting layer 5 on the barrier layer, and an electroconductive layer 6 embedded in the opening part or the depressed part via the barrier layer 4 and the metal growth promoting layer 5.

7 Claims, 19 Drawing Sheets

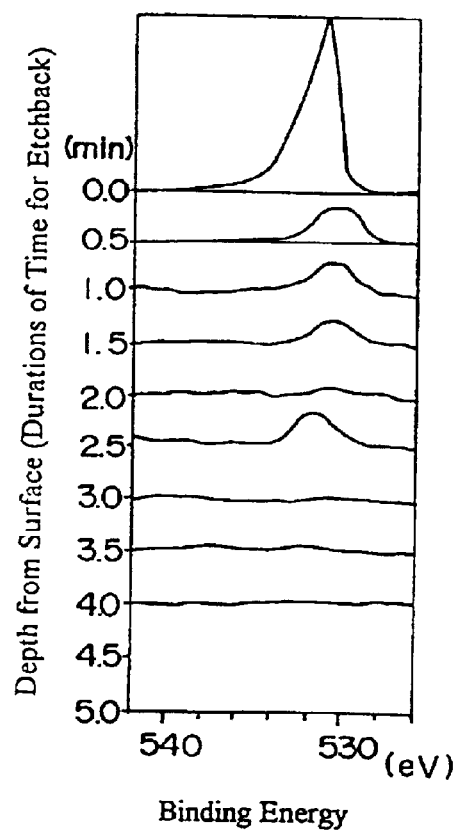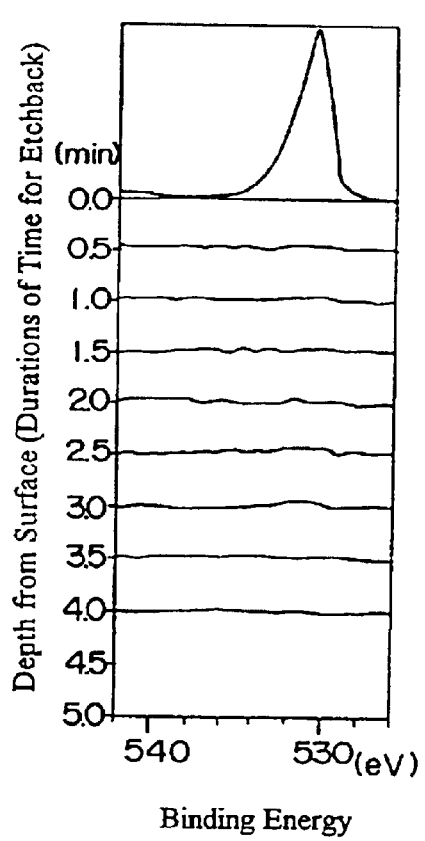

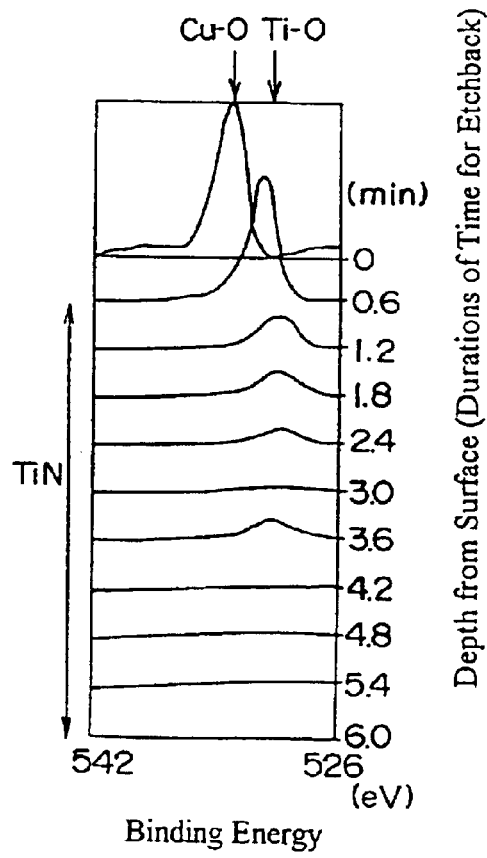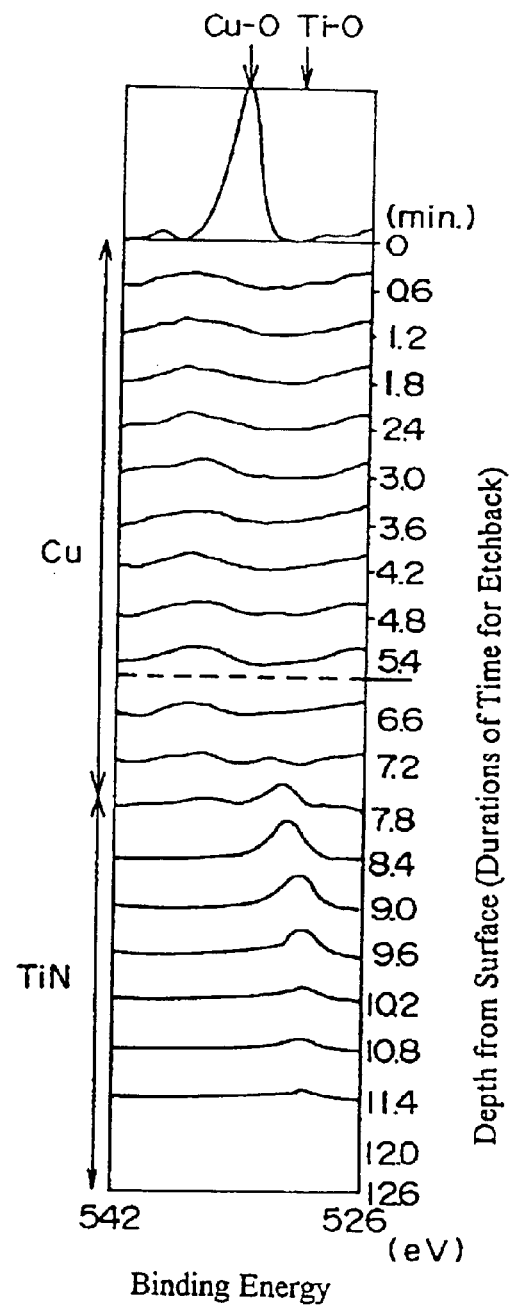

EMBEDDED ELECTROCONDUCTIVE LAYER STRUCTURE

This is divisional, of application Ser. No. 08/959,763, filed Oct. 29, 1997 U.S. Pat. No. 6,090,702 which in turn is a divisional of Ser. No. 08/660,524 (U.S. Pat. No. 5,736,192) filed Jun. 7, 1996.

BACKGROUND OF THE INVENTION

1. Field of the Invention

This invention relates to an embedded electroconductive layer and a method for the formation thereof. It relates more particularly to an embedded interconnection layer using Cu and Al or a connecting layer (plug) for joining an upper and a lower interconnection layer and a method for the formation thereof.

2. Description of the Prior Art

For the purpose of lowering the resistance offered by an interconnection layer, the feasibility of substituting a Cu interconnection layer for the conventional Al interconnection layer has been the subject of a diligent study. Cu has lower resistivity than Al and about twice as high electromigration resistance as Al.

Generally, the formation of a layer of fine wiring lines requires resorting to dry etching.

Cu, however, encounters the problem that the conventional RIE (reactive ion etching) technique fails to afford an ample etching rate at low temperatures because a halogenide of Cu has a low vapor pressure. It also has the problem of rendering anisotropic etching difficult.

The feasibility of a method which is called damascene and uses the self-aligning technique for the purpose of solving such problems as mentioned above is now being studied.

The damascene method resides in forming an embedded interconnection layer as follows. First a Cu layer is deposited in grooves and contact holes formed in an insulating layer in conformity with a wiring pattern. Then, the unwanted parts of the Cu layer that protrude from the grooves and the contact holes are removed by chemical mechanical polishing (CMP).

Among the methods available at all for the deposition of Cu in this case is counted the CVD method that excels in step coverage. The combination of the sputtering method deficient in step coverage with the reflow method is also available. Of these two methods, the former CVD (chemical vapor deposition) method is expected to grow into a prospective technique for the formation of a Cu interconnection layer fit for future trend toward increasing fineness of circuitry.

Further, Cu easily diffuses in $SiO_2$, forms a deep sublevel in a silicon semiconductor, and curtails the service life of minority carriers. In the formation of a Cu interconnection layer by the damascene method, a barrier metal layer such as the TiN layer is formed on an $SiO_2$ layer and a Cu layer is grown thereon for the purpose of preventing Cu from diffusing in the $SiO_2$ ("Advanced Metallization for ULSI Application," compiled by V. S. Rana et al., written by J. A. T. Norman, D. A. Roberts, A. K. Hochberg, and R. Laxman, and published by MRS, Pittsburgh, 1993).

When a Cu layer is grown by the CVD method on such a CVD-TiN layer as mentioned above, an anneal performed in the neighborhood of 600° C. tends to induce an alloying reaction between Cu and the barrier metal, though the incubation time between the time the step of deposition starts and the time the actual deposition of film begins decreases in proportion as the degree of oxidation on the surface of the barrier layer decreases. The growth of the Cu layer under discussion, therefore, encounters the problem that the CVD-TiN layer does not function as a barrier metal.

When a TiN layer which has a higher oxygen concentration than the CVD-TiN layer and is formed by the sputtering technique (hereinafter referred to as "PVD (physical vapor deposition)-TiN layer") is used for the purpose of exalting the barrier property, the problem ensues that the incubation time is elongated.

The cause for the elongation of the incubation time is as follows. It has been reported (S. Cohen et al., Appl. Phys. Lett., Vol. 60(1), 6 January 1992 p.50–52) that during the deposition of a Cu layer using hexafluoroacetylacetonate trimethylvinyl silane Cu:Cu (hfac) TMVS as a precursor, for example, the precursor is caused to undergo decomposition and precipitate Cu owing to the donation of electrons from the surface of the ground layer. When the barrier layer constituting a ground layer has a high oxygen concentration and exhibits low metallicity, therefore, the incubation time is suffered to elongate because the donation of electrons from the surface of the barrier layer does not easily occur.

When an embedded electroconductive layer is formed by having an insulating film such as of copper embedded through the medium of a barrier layer in a groove as described above, this barrier layer is demanded to fulfill such mutually contradicting requirements as enhancing the barrier property of the barrier layer and curtailing the incubation time.

SUMMARY OF THE INVENTION

An object of this invention is to shorten the incubation time involved during the formation of an embedded Cu interconnection layer through the medium of a barrier layer and, at the same time, exalt the barrier property of a ground layer to Cu.

Another object of this invention is to simplify the step for forming an embedded electroconductive layer on a barrier layer.

In the formation of an embedded Cu interconnection layer 6, by using a barrier layer 4 a metal growth promoting layer (a TiN layer containing oxygen at a lower concentration than the barrier layer) 5 jointly as a ground layer 10 as shown in FIG. 1, the incubation time can be curtailed without impairing the barrier property. The verification experiment conducted on this point by the present inventor will be described below.

FIG. 2A and FIG. 2B are diagrams showing the results obtained respectively of a PVD-TIN layer and a CVD-TiN layer by allowing the layers to stand in an ambience of oxygen for stated durations of time and determining oxygen concentrations in the layers at the ends of these durations. The oxygen concentration mentioned above was detected by measuring the bond energy originating in the Is electron orbit of oxygen in the relevant layer.

In the PVD-TIN layer with inferior step coverage, oxygen was detected in significant amounts down to a depth of 625 nm from the surface reached by 2.5 minutes of etchback performed at an etching rate of 250 nm/minute as shown in FIG. 2A.

In contrast, in the CVD-TiN layer with excellent step coverage, substantially no oxygen was detected except on the surface as shown in FIG. 2B. This contrast may be logically explained by a supposition that since the PVD-TiN layer had small crystal grain particles are compared with the CVD-TiN layer, the former layer permitted easier entrance of oxygen from the ambient air than the latter layer.

FIG. 3 is a diagram showing a difference in the amount of growth of Cu ($\times 10^{-4}$ g·cm$^{-2}$) due to a difference in the method of manufacture of a ground layer. A PVD-TIN layer 5 and a CVD-TIN layer were respectively used as ground layers and a Cu layer was formed on each of the ground layers by the CVD method.

In the sample using the CVD-TIN layer, deposition of the Cu layer started nearly at the same time that supply of a reaction gas was started during the step of deposition. In the sample using the PVD-TIN layer, substantially no deposition of the Cu layer occurred even after the elapse of 100 seconds following the start of supply of the reaction gas indicating that this layer had a long incubation time. When hexafluoroacetylacetonate trimethylvinyl silane Cu:Cu (hfac) TMVS is used as a precursor in the deposition of the Cu layer, for example, the precursor is caused to precipitate Cu by the donation of electrons from the surface of the ground layer. When the barrier layer 4 destined to serve as a ground layer has a high oxygen concentration and exhibits low metallicity, therefore, the incubation time is elongated because the donation of electrons from the surface of the barrier layer 4 does not easily occur (S. Cohen et al., Appl. Phys. Lett., Vol. 60, 1992, p. 995).

Now, preferred concrete examples of the barrier layer 4 according to this invention will be cited below.

Firstly, a Ti-Si-N layer in an amorphous state is used. It excels a crystalline layer in the barrier property relative to Cu.

A sputtering method, particularly a collimation sputtering method, or a long throw sputtering method forms one of the methods which are available for forming the Ti-Si-N layer in an amorphous state. The long throw sputtering method requires the interval between a target and a substrate under treatment to be not less than 10 cm. Adoption of this method results in exalting the step coverage because it adds to the parallelism of atoms being sputtered. Another method that is available for the formation of the Ti-Si-M layer in an amorphous state uses a procedure comprising the steps of depositing a TiN layer and then thermally treating the TiN layer in an ambience of SiH, gas.

Secondly, a WN$_x$ layer (x=0 to 1) or a TaN$_x$ layer (x=0 to 1) is used. The layer exhibits the barrier property relative to Cu even at 800° C.

Thirdly, a TIN layer having an oxidized surface is used. This layer is obtained, for example, by depositing a TIN layer and then thermally treating the TIN layer in an ambience of nitrogen. The trace oxygen entrained by the nitrogen serves to oxidize the surface of the TIN layer.

Fourthly, an Al$_2$O$_3$ layer is used. This layer is formed by depositing an Al layer and then thermally treating the Al layer in an oxidizing ambience.

The following methods are available for the formation of the TIN layer 5 having a low oxygen concentration.

Firstly, a chemical vapor growth method is available. This method can compensate for the thin-wall part of the barrier layer 4 destined to form a ground layer by heightening the step coverage of the layer serving to curtail the incubation time.

Secondly, a collimation sputtering method or a long throw sputtering method is available. Adoption of such a sputtering method results in improving to a fair extent the step coverage of the step intended to curtail the incubation time.

Such unwanted reactions as the oxidation with the oxygen from the ambient air and the contamination with a defiling substance can be prevented by causing the series of steps ranging from that of deposition of the barrier layer 4 through that of deposition of the Cu layer 6 to be continuously carried out as one process.

Now, other methods for forming a ground layer capable of curtailing the incubation time without impairing the barrier property will be described below with reference to FIG. 4 through FIG. 6.

FIG. 4 is a cross section showing the construction of the principle of this invention, FIG. 5 is a diagram showing the dependency of the amount of growth of the Cu layer on the DMH (dimethyl hydrazine) treatment, and FIG. 6 is an explanatory diagram of the reducing effect of the DMH treatment manifested on the treated surface.

First, the surface of a ground layer 10a is reduced to form a layer 7b of a low oxygen concentration on the surface of the ground layer 10a prior to the growth of the electroconductive layer 6. As a result, this layer 7b acquires exalted metallicity and permits easy supply of electrons from the surface thereof. Thus, the decomposition of the precursor is promoted and the deposition of Cu is accelerated.

The event of this process will be explained below with reference to FIG. 5.

FIG. 5 shows the dependency of the amount of growth of Cu (x $10^{-4}$ gcm$^{-2}$) on a substrate obtained when the Cu layer was deposited by the CVD method each on the surface of a PVD-TiN film having undergone a reducing treatment with dimethyl hydrazine (DMH), (CH$_3$)$_2$N—NH$_2$, and the surface of a PVD-TiN film not having undergone the reducing treatment.

In the case of the sample of FIG. 5(b) which had undergone the DMH treatment, deposition of the Cu layer started nearly at the same time that the supply of a reaction gas started at the step of deposition. In contrast, in the case of the sample of FIG. 5(a) which had not undergone the DMH treatment, substantially no deposition of the Cu layer occurred even after the elapse of 100 seconds following the start of the step of deposition, indicating that the substrate had a long incubation time.

The amount of growth in this case was determined by means of ICP-AES (inductively coupled plasma-atomic emission spectroscopy. After two minutes' deposition, for example, the sample using the DMH treatment showed a growth of the Cu layer in a thickness of 3000 Å, which was about 8 times the thickness of the Cu layer grown on the sample using no DMH treatment.

Specifically, the speed of deposition in the sample using the DMH treatment was 1500 Å/minute, i.e. about 8 times that in the sample using no DMH treatment and about 1.5 times that (about 1000 Å/minute) of the sample obtained by depositing a CVD-TiN film on the layer 7b of a low oxygen concentration of the ground layer 10a proposed formerly by the present inventor.

Now, the effect of the DMH treatment on the reduction of the surface will be described below with reference to FIG. 6A and FIG. 6B.

FIGS. 6A and 6B show the results of the determination of oxygen concentration in the Cu layer performed in the sample not having undergone the DMH treatment and the sample having under-gone the DMH treatment respectively prior to the deposition of Cu by measuring the binding energy originating in the 1s electron orbit of oxygen in the layer.

It is clearly noted from FIG. 6A that in the sample using no DMH treatment, oxygen was detected in significant amounts down to a depth of 900 nm from the surface of the grown layer reached by 3.6 minutes of etchback performed at an etching rate of 25 nm/minute, namely down to a depth of 750 nm from the surface of the TiN film reached by 3 minutes of etchback and that the oxygen concentration of the surface of the TIN film was very high.

It is clearly noted from FIG. 6B that in the sample using the DMH treatment, although oxygen was detected in significant amounts down to a depth of 750 nm from the surface of the TiN film reached by 3 minutes of etchback, the oxygen concentration of the surface of the TIN film was conspicuously low.

The reducing treatment given to the surface of the ground layer 10a, therefore, curtails the incubation time of the electroconductive layer 6 and increases the speed of deposition and the residual oxygen in the interior 7b of the ground layer 10a secures the barrier property.

By performing the reducing treatment as part of the step for elevating the temperature up to the level at which the growth of the electroconductive layer 6 is started, the reduced surface can be retained in a perfect condition because the ground layer 10a after the reduction has no possibility of being exposed to the atmosphere.

Further by effecting thorough oxidation of the ground layer 10a prior to the step for reducing the ground layer 10a, the barrier property can be exalted and the formation of a deep level caused by the entry of Cu into the silicon substrate and suffered to exert an adverse effect on the life time of the carrier can be repressed.

Now, preferred concrete examples of a reducing gas 8 will be cited below. Firstly, dimethyl hydrazine (DMH) is available (T. Obba et al., Proc. Advanced Metallization for VLSI Applications, MRS. p. 211, 1992). This compound is utilized in forming a TiN film by nitriding a Ti film.

Secondly, monomethyl hydrazine (MMH) which has the same nitriding action as DMH is available.

Thirdly, silane is available. Properly in this case, the thermal treatment is carried out at a relatively low temperature because this compound has the possibility of reacting at a high temperature and producing an amorphous Ti-Si-N film.

This invention is also directed to a method for the formation of an embedded electroconductive layer by the steps of depositing a barrier layer 4 on the surface of a depressed part 3 formed in an insulating layer 2, then growing an electroconductive layer 6 to fill up the depressed part 3 by the chemical vapor growth method using a metallic precursor, which method is characterized by exposing the barrier layer 4 to an etching ambience prior to the growth of the electroconductive layer 6 thereby removing the surface of the barrier layer 4 by etching.

When the barrier layer 4 is a CVD-TiN film, an oxygen-containing layer is present only on the surface thereof. By removing the surface of the barrier layer 4 by etching, therefore, the barrier layer 4 is enabled to curtail the incubation time thereof.

When the embedded electroconductive layer 6 is utilized as a interconnection layer, the oxygen concentration in the barrier layer 4 must be increased to secure the barrier property. When the electroconductive layer 6 is utilized as a connecting layer (plug) for joining interconnection layers, the oxygen concentration in the barrier layer 4 does not need to be increased because the layer is not required to possess the barrier property.

As the etching ambience mentioned above, an ambience which is formed of any one compound selected from among $ClF_3$, $NF_3$, and $BCl_3$ is preferably used.

Now, preferred concrete examples of the precursor will be cited below. Firstly, a metal complex of Cu is available. For the growth of Cu by the CVD method, it is advantageous to use such a metal complex of Cu as Cu (hfac) TMVS.

Secondly, a metal compound of Al is available. For the growth of Al by the CVD method using a precursor, It is proper to use such a metal compound of Al as dimethyl aluminum hydride (DMAH) as the precursor.

Thirdly, a combined supply of a metal complex of Cu with a metal compound of Al is available. This supply permits formation of an embedded interconnection layer made of an Al-Cu alloy capable of offering better resistance to electromigration than Al.

BRIEF DESCRIPTION OF THE DRAWINGS

FIG. 2A is a diagram showing the oxygen content of a PVD-TIN layer and FIG. 2B a diagram showing the oxyget content of a CVD-TIN layer.

FIG. 6A and FIG. 6B are diagrams showing the effect of reduction manifested by the DMH treatment on the surface.

DESCRIPTION OF THE PREFERRED EMBODIMENT

First Embodiment

The first embodiment of this invention will be described below with reference to FIGS. 7A to 7E. The reaction devices which are mentioned in the embodiments of this invention are assumed to have inner volumes of 40–80 liters.

Figure 1:
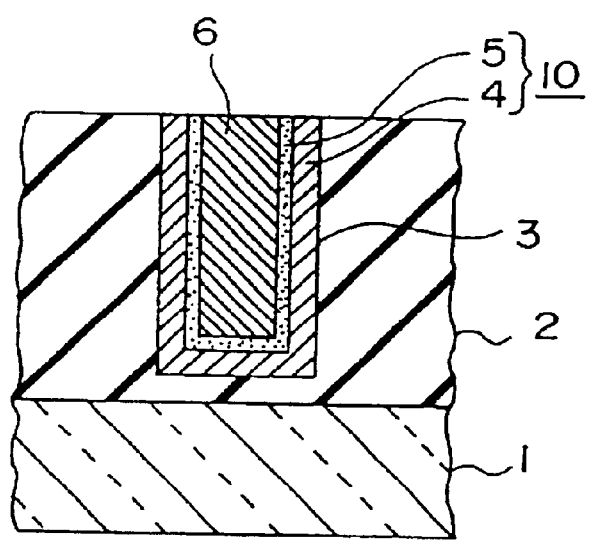
FIG. 1 is a cross section showing the construction of the principle of this invention.
Figure 3:
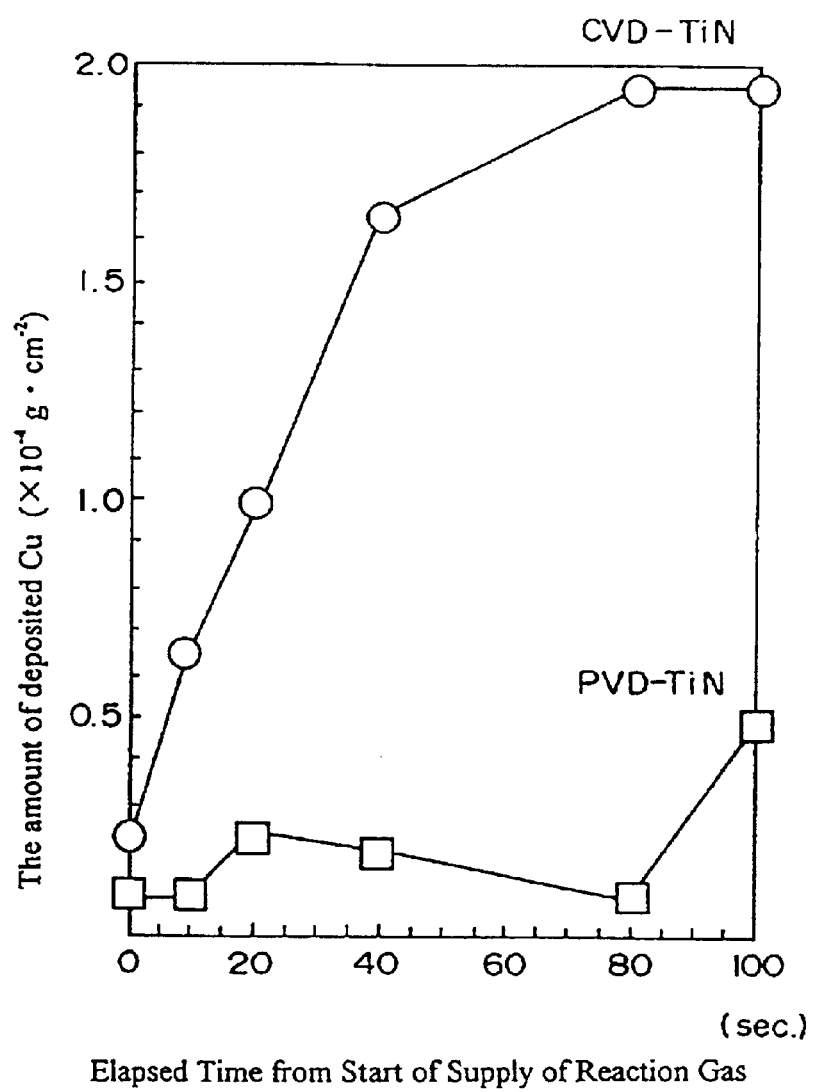
FIG. 3 is a diagram showing the dependency of the amount of growth of a Cu layer on the substrate to aid in the description of the operation of this invention.
Figure 4A:
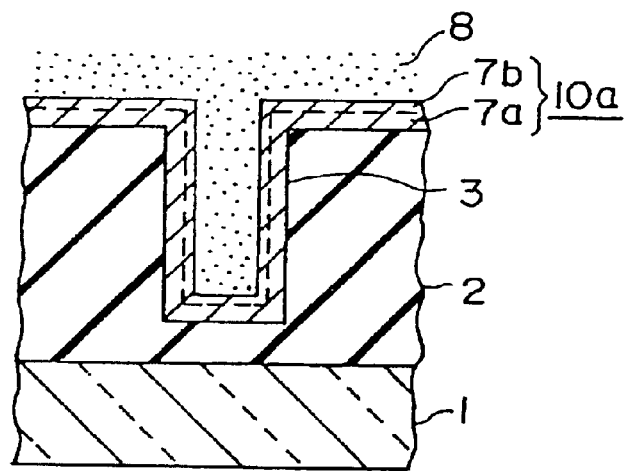
FIG. 4A and FIG. 4B are cross sections showing the construction of the principle of this invention.
Figure 4B:
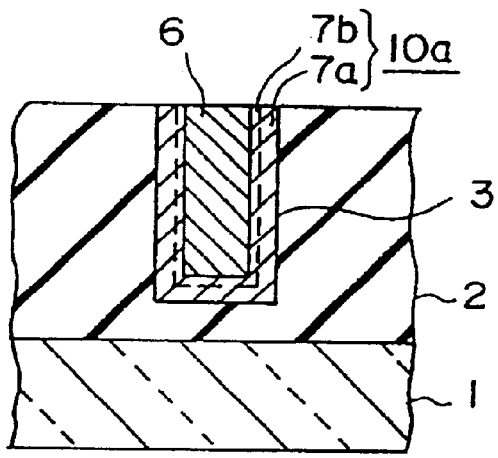
Figure 5:
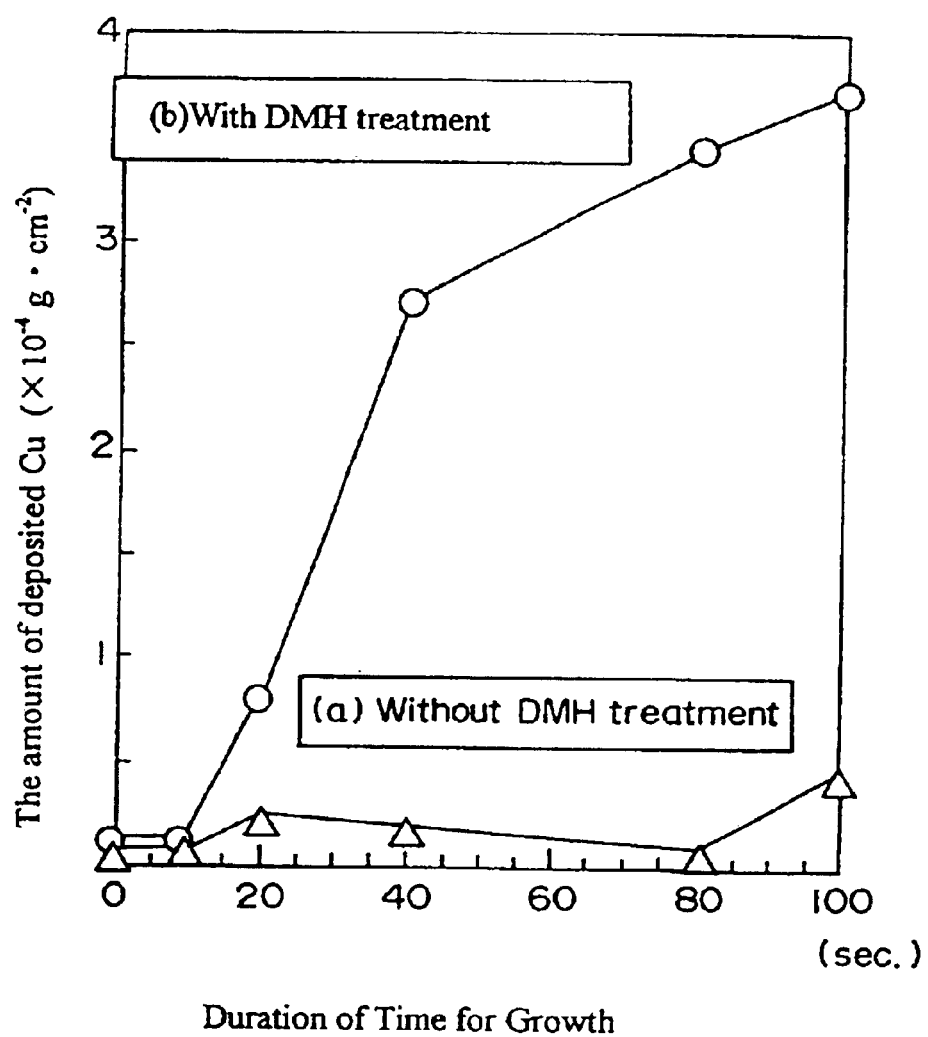
FIG. 5 is a diagram showing the difference in the amount of growth of a Cu layer due to the presence or absence of the DMH treatment on the ground layer.
Figure 7A:
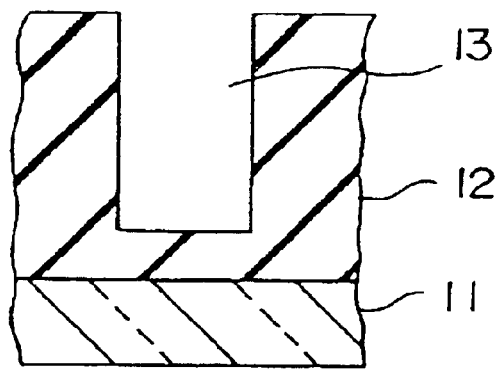
FIG. 7A to FIG. 7E are cross sections showing a process of production according to the first embodiment of this invention.

First, an SiO, layer 12 is deposited in a thickness of 600 nm by the plasma CVD method on a silicon substrate 11 having a 6-inch (about 15 cm) (100) plane 6 as a main surface thereof, a photoresist is applied thereon in a thickness of 0.6 μm and then the $SiO_2$ layer 12 is covered with a mask of photoresist pattern formed in advance through the steps of exposure and patterning and etched along a wiring pattern by the use of an i ray (365 nm) to form a groove 13 of a width of 300 nm and a depth of 500 nm as shown in FIG. 7A.

In this case, a TEOS (tetra-ethyl-orthosilicate)-$SiO_2$ layer, an SOG (spin-on glass) layer, or a PSG (phosphosilicate glass) layer may be used for the $SiO_2$ layer 12. Otherwise, the $SiO_2$ layer 12 may be formed by thermally oxidizing the surface of the silicon substrate 11.

Alternatively, this $SiO_2$ layer 12 may be formed on other insulating layer such as of $Si_3N_4$ or on a metallic layer such as of TiN or W instead of being directly formed on the surface of the silicon substrate 11.

Figure 7B:
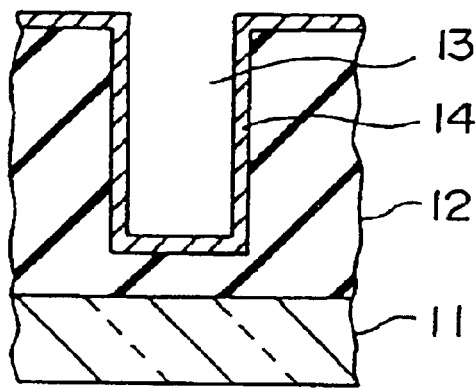

Then, a Ti-Si-N film 14 is deposited in a thickness in the range of 10 to 50 nm, preferably in a thickness of 30 nm, by the reactive sputtering method using a target of $TiSi_{0.6}$ as shown in FIG. 7B. The $TiSi_{0.6}$ target used in this case had a diameter of about 30 cm and a thickness of about 3 cm. A mixed gas consisting of Ar and $N_2$ at a flow volume ratio in the range of 1 to 2, preferably a flow volume ratio of 1, is used. The flow volume of Ar is 10 to 100sccm, preferably 50 sccm and the flow volume of $N_2$ is 10 to 100 sccm, preferably 50 sccm. These gases are converted into plasma by exposure to an electric power in the range of 0.5 to 1.5 W. The Ti-Si-N film 14 is obtained in an amorphous state as a result. This film 14 exhibits a perfect barrier property to Cu (Iijima et al. Collection of Manuscripts for Lectures, 30a-K10, published at the 42nd Joint Lecture Meeting of Physicists Societies held in the spring of 1995).

Subsequently, the Ti-Si-N film 14 is annealed at a temperature in the range of 450 to 600° C., preferably at 600° C. for a period in the range of 20 to 60 minutes, preferably for 30 minutes, for the purpose of improving fast adhesiveness.

Figure 7C:
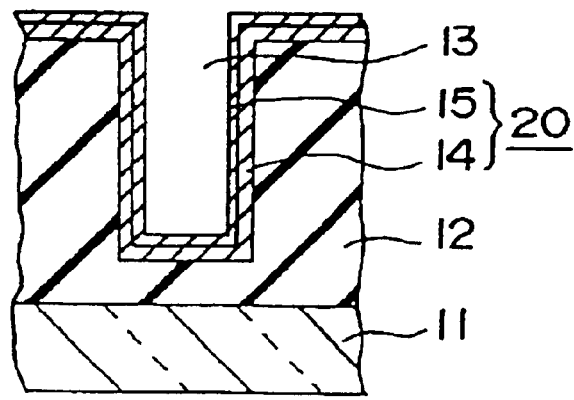

Then, a CVD-TiN layer 15 is deposited by the CVD method as shown in FIG. 7C. $TiCl_4$ supplied at a flow volume in the range of 10 to 30 sccm, preferably at 10 sccm, He supplied at a flow volume in the range of 40 to 80 sccm, preferably at 50 sccm, methyl hydrazine supplied at a flow volume in the range of 0.4 to 0.8 sccm, preferably at 0.7 sccm, and $NH_3$ supplied at a flow volume in the range of 400 to 800 sccm, preferably at 500 sccm are introduced into a growth chamber, with the pressure inside the growth chamber kept in the range of 50 to 200 mTorrs, preferably at 100 mTorrs. The substrate temperature is kept in the range of 500 to 600° C., preferably at 600° C. By retaining this state for about 40 seconds, the CVD-TiN layer 15 is deposited in a thickness in the range of 10 to 30 nm, preferably in a thickness of 20 nm. A ground layer 20 is completed as a result.

This CVD-TiN layer 15 enjoys a decreased incubation time because it has a lower oxygen concentration and exhibits better step coverage than the PVD-TiN layer obtained by the sputtering method. Moreover, it can compensate for the thin-wall part of the amorphous Ti-Si-N film 14 destined to form an underlying barrier layer.

Figure 7D:
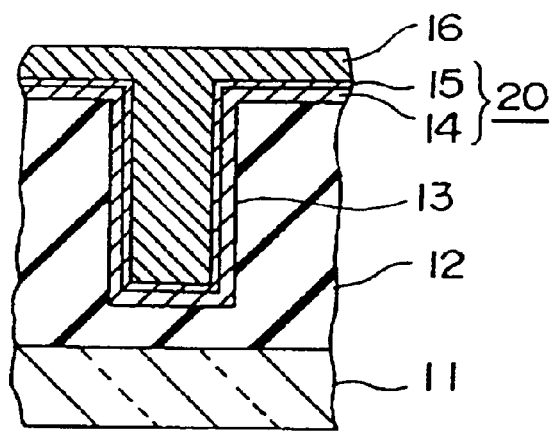
Figure 7E:
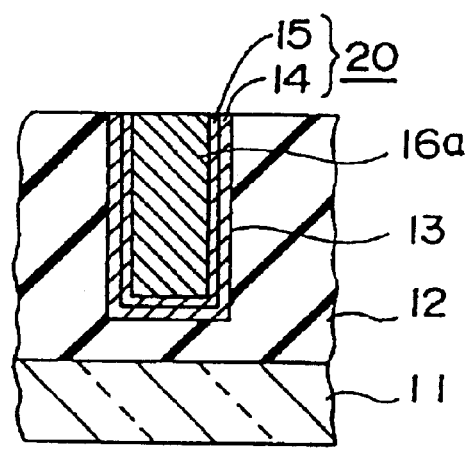

Then, a CVD-Cu layer 16 is formed by the CVD method as shown in FIG. 7D. By using $H_2$ supplied at a flow volume in the range of 100 to 1000 sccm, preferably at a flow volume of 500 sccm, as a carrier gas, Cu (hfac) TMVS is supplied at a rate in the range of 0.1 to 1.0 g/minute, preferably at a rate of 0.3 g/minute. The pressure in the growth chamber is kept in the range of 100 to 500 mTorrs, preferably at 200 mTorrs. The substrate temperature is kept in the range of 120 to 220° C., preferably at 160° C., to attain the deposition of the CVD-Cu layer 16. After the elapse of 20 minutes thereafter, the CVD-Cu film 16 is embedded in the groove 13 and, at the same time, superposed on the CVD-TiN film 15 outside the groove 13.

Then, the surface of the substrate is polished by the CMP (chemical mechanical polishing) method. An abrading material based on an alumina powder is used as the slurry. The polishing pressure is kept in the range of 200 to 300 g/cm², preferably at 250 g/cm² The rotational rate of the polisher is in the range of 50 to 100 revolutions/minute, preferably at 50 revolutions/minute. When this polishing is continued for 1 to 2 minutes, the unwanted parts of the CVD-Cu layer 16 through the Ti-Si-N film 14, namely the parts the CVD-Cu layer 16 through the Ti-Si-N film 14 which rise above the height of the groove 13 formed in the $SiO_2$ layer 12, are removed. As a result an embedded Cu interconnection layer 16a is formed in the groove 13.

The Cu interconnection layer 16a thus obtained suffers a signal delay only sparingly because it has low resistivity as compared with the Al interconnection layer. It further enables a semiconductor device to enjoy improved reliability because it spends about twice as much time in fulfilling its duty before sustaining line failure due to electromigration as the Al interconnection layer.

Second Embodiment

Figure 8A:
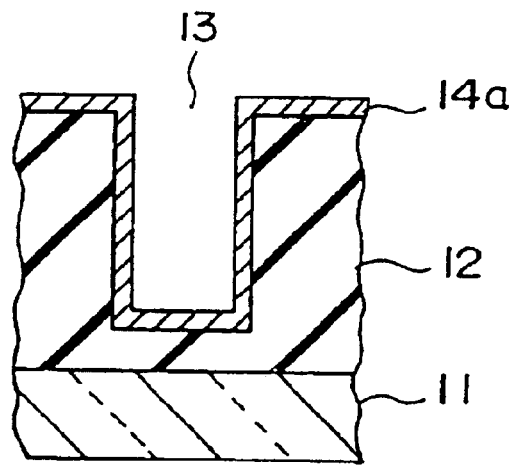
FIG. 8A and FIG. 8B are cross sections showing a process of production according to the second embodiment of this invention.

Now, the second embodiment of this invention will be described below with reference to FIG. 8A and FIG. 8B.

First. In the same manner as in the first embodiment, the groove 13 for wire distribution is formed in a width of 300 nm and a depth of 500 nm in the $SiO_2$ layer 12 deposited in a thickness of 600 run on the silicon substrate 11 and a WNX layer 14a (x =0 to 1) of a thickness in the range of 10 to 30 nm, preferably 30 nm, is deposited thereon as a barrier layer by the RF sputtering method as shown in FIG. 8A.

A $TaN_x$, layer (x =0 to 1) may be used in the place of the $WN_x$ layer 14a (x =0 to 1). This film exhibits a perfect barrier property to Cu even at such a high temperature as 800° C. (Oku et al., Collection of Manuscripts for Lectures, 30p-K-10, published at the 42nd Joint Lecture Meeting of Physicists Societies held in the spring of 1995).

Figure 8B:
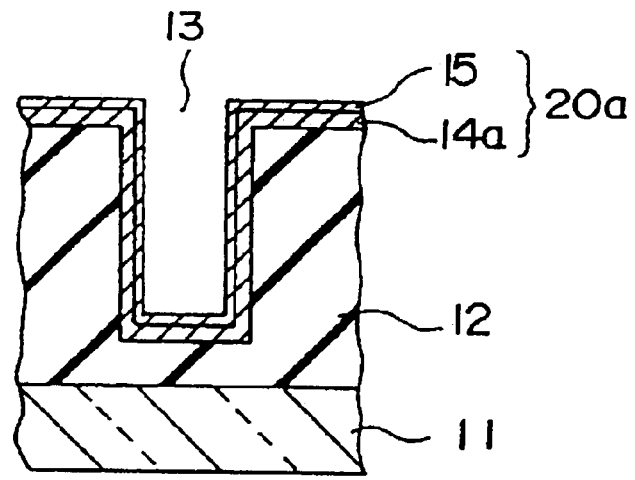

Then, in the same manner as in the first embodiment, the CVD-TIN layer 15 of a thickness of 20 nm is deposited by the CVD method as shown in FIG. 8B. With a two-ply structure imparted to a ground layer 20a destined to support the Cu layer, the barrier property is improved by the $WN_x$, layer 14a and, at the same time, the incubation time is curtailed by the CVD-TJA layer 15.

Then, In the same manner as in the first embodiment, a CVD-Cu layer is deposited by the CVD method using Cu (hfac) TMVS as a precursor. Subsequently, an embedded Cu interconnection layer is completed by removing the unwanted parts of the CVD-Cu layer, CVD-TIN layer 15, and $WN_x$ layer 14a by the chemical mechanical polishing method.

Third Embodiment

Now, the third embodiment of this invention will be described below with reference to FIG. 9A to FIG. 9C.

Figure 9A:
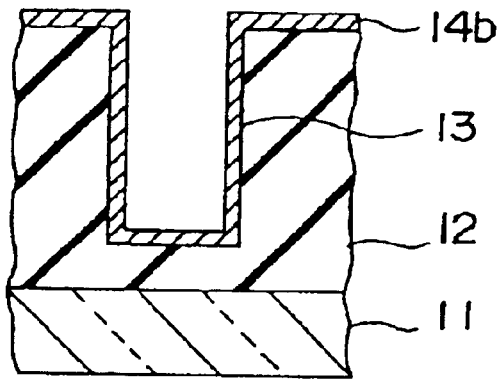
FIG. 9A to FIG. 9C are cross sections showing a process of production according to the third embodiment of this invention.

First, in the same manner as in the first embodiment, the groove 13 destined to encase a interconnection layer therein is formed in the $SiO_2$ layer 12 deposited in a thickness of 600 nm on the silicon substrate 11 as shown in FIG. 9A. The groove 13 has a width of 300 nm and a depth of 500 nm. Subsequently, A PVD-TIN layer 14b Is deposited in a thickness in the range of 10 to 30 nm, preferably in a thickness of 30 nm, by the magnetron sputtering method.

Figure 9B:
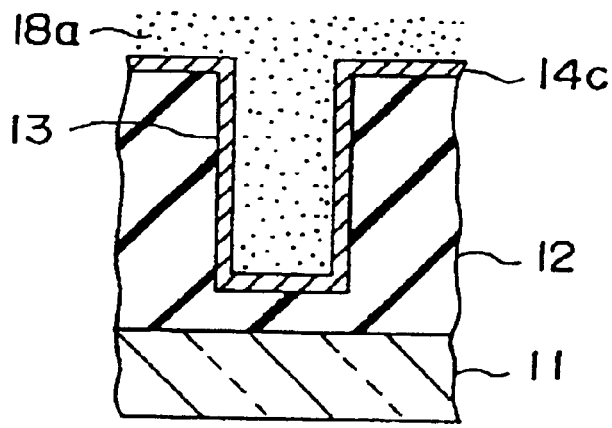

Then, the PVD-TiN layer 14b is oxidized to form a TiN layer 14c having an oxidized surface as shown in FIG. 9B. $N_2$ gas is supplied at a flow volume in the range of 20000 to 30000 sccm, preferably at a flow volume of 30000 sccm, and the substrate temperature is kept in the range of 400 to 500° C., preferably at 450° C. In the ambience of $N_2$, the layer is annealed for a period in the range of 20 to 60 minutes, preferably for 30 minutes.

The oxidation in this case is caused by the trace of oxygen which is entrained in the $N_2$ gas. The oxidation gives rise to the TiN layer 14c which has an oxidized surface of improved barrier property. This layer functions as a barrier layer.

Figure 9C:
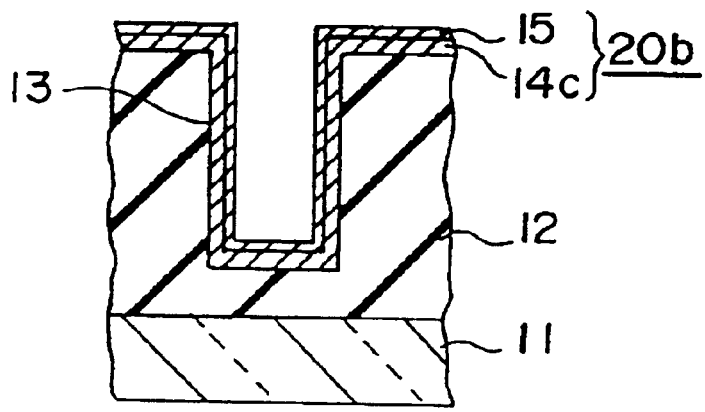

Then, in the same manner as in the first embodiment, the CVD-TIN layer 15 is deposited in a thickness of 20 nm by the CVD method as shown in FIG. 9C. With a two-ply structure imparted to a ground layer 20b destined to support the Cu layer, the barrier property is improved by the TiN layer 14c and, at the same time, the incubation time is curtailed by the CVD-TiN layer 15.

Then, in the same manner as in the first embodiment, the CVD-Cu layer is deposited by the CVD method using Cu (hfac) TMVS as a precursor. Subsequently, the embedded Cu interconnection layer is formed by removing the unwanted parts of the CVD-Cu layer, the CVD-TiN layer 15, and the TIN layer 14c of an oxidized surface by the chemical mechanical polishing method.

Fourth Embodiment

Now, the fourth embodiment of this invention will be described below with reference to FIG. 10A to FIG. 10C.

Figure 10A:
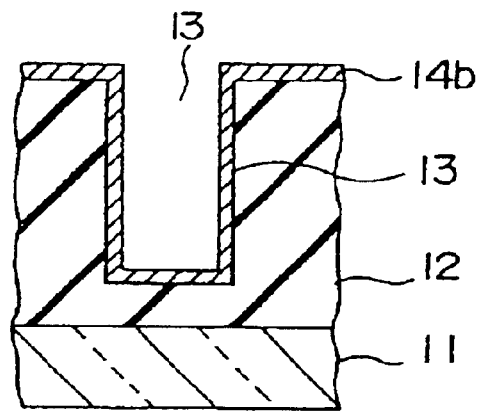
FIG. 10A to FIG. 10C are cross sections showing a process of production according to the fourth embodiment of this invention.

First, in the same manner as in the first embodiment, the groove 13 of a width of 300 nm and a depth of 500 nm destined to encase a interconnection layer therein is formed in the $SiO_2$ layer 12 deposited in a thickness of 600 nm on the silicon substrate 11 as shown in FIG. 10A. Subsequently, the PVD-TiN layer 14b is deposited in a thickness in the range of 10 to 30 nm, preferably in a thickness of 30 nm, by the magnetron sputtering method.

Figure 10B:
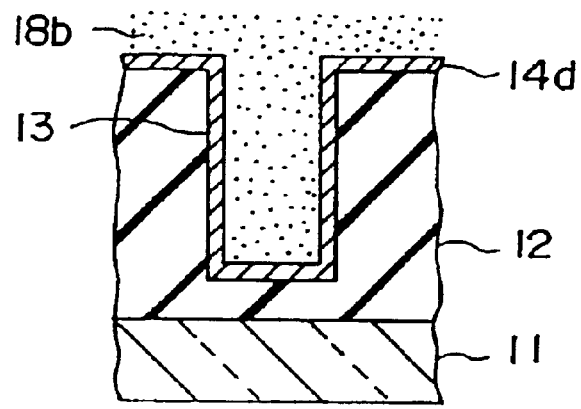

Then, the PVD-TiN layer 14b is annealed in an ambience of $SiH_4$ gas and converted into an amorphous Ti-Si-N layer 14d as shown in FIG. 10B. At this time, the $SiH_4$ gas is supplied at a flow volume in the range of 50 to 200 sccm, preferably at a flow volume of 100 sccm and the substrate temperature is kept in the range of 400 to 600° C., preferably at 600° C., for a period in the range of 20 to 30 minutes, preferably for a period of 30 minutes.

The amorphous Ti-Si-N layer 14d in this case exhibits as perfect a barrier property to Cu as the Ti-Si-N layer 14 formed by the sputtering method in the first embodiment.

Figure 10C:
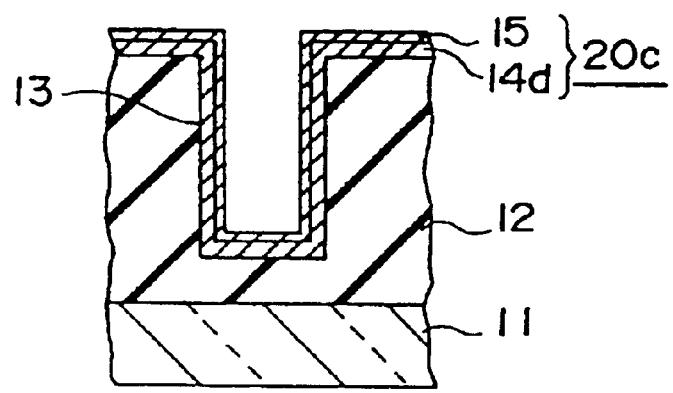

Then, in the same manner as in the first embodiment, the CVD-TIN layer 15 is deposited in a thickness of 20 nm by the CVD method as shown in FIG. 10C. With a two-ply structure imparted to the ground layer destined to support the Cu layer, the barrier property is improved by the TiN layer 14d and, at the same time, the incubation time is curtailed by the CVD-TiN layer 15.

Then, in the same manner as in the first embodiment, the CVD-Cu layer is deposited by the CVD method using Cu (hfac) TMVS as a precursor. Subsequently, the embedded Cu interconnection layer is informed in the groove 13 by removing the unwanted parts of the CVD-Cu layer, the CVD-TIN layer 15, and the amorphous Ti-Si-N layer 14d by the chemical mechanical polishing method.

Fifth Embodiment

Now, the fifth embodiment of this invention will be described below with reference to FIG. 11A to FIG. 11C.

Figure 11A:
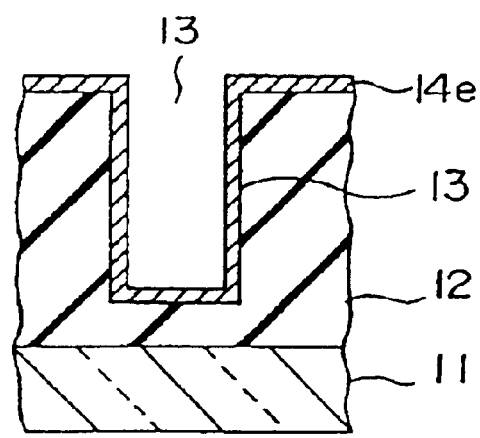
FIG. 11A to FIG. 11C are cross sections showing a process of production according to the fifth embodiment of this invention.

First, in the same manner as in the first embodiment, the groove 13 of a width of 300 nm and a depth of 500 nm destined to encase a interconnection layer therein is formed in the $SiO_2$ layer 12 deposited in a thickness of 600 nm on the silicon substrate 11 as shown in FIG. 11A. Subsequently, an Al layer 14e is deposited in a thickness in the range of 5 to 10 nm, preferably in a thickness of 10 nm, by the sputtering method.

Figure 11B:
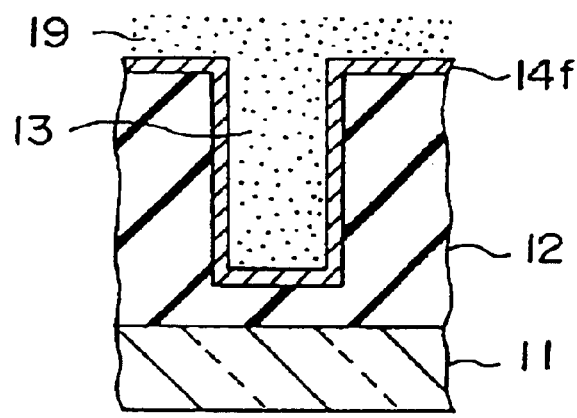

Then, the resultant superposed layers are annealed in the oxidizing ambience 19 to oxidize the Al layer 14e and convert it into an $Al_2O_3$, layer 14f as shown in FIG. 11B. The $Al_2O_3$ layer 14f functions as a barrier to Cu.

Figure 11C:
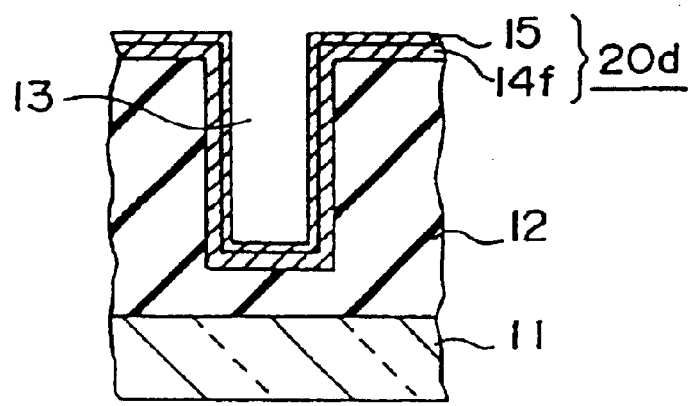

Then, in the same manner as in the first embodiment, the CVD-TiN layer 15 is deposited in a thickness of 20 nm by the CVD method as shown in FIG. 11C. With a two-ply structure imparted to the ground layer 20d destined to support the Cu layer, the barrier property is improved by the $Al_2O_3$ layer 14f and, at the same time, the incubation time is curtailed by the CVD-TiN layer 15.

Then, in the same manner as in the first embodiment the CVD-Cu layer is deposited by the CVD method using Cu (hfac) TMVS as a precursor. Subsequently, the embedded Cu interconnection layer is formed in the groove 13 by removing the unwanted parts of the CVD-Cu layer, the CVD-TiN layer 15, and the $Al_2O_3$ layer 14f by the chemical mechanical polishing method.

In the embodiments described above, the RF sputtering method or the magnetron sputtering method is adopted at the step of forming the barrier layers 14, 14a, and 14b. The formation of the barrier layer does not need to be limited to this method. Any of various other sputtering methods may be used instead.

The means to form the CVC-TiN film 15 which is intended to curtail the incubation time in each of the embodiments described above does not need to be limited to the CVD method. For example, the collimation sputtering method or the long throw sputtering method may be adopted instead.

The collimation sputtering method is characterized by having interposed between a target and a substrate under treatment a collimator which is provided with passageways resembling the openings in a honeycomb. Owing to the collimator, this method effects the deposition of the CVD-TiN film 15 by exclusively utilizing relatively parallel sputter atom components, namely the sputter atom components which are relatively perpendicular to the substrate under treatment. This method, therefore, provides good step coverage as compared with the ordinary sputtering method and allows the surface of the $SiO_2$ layer 12 formed in the groove 13 to be covered with a coating of a relatively uniform wall thickness.

The long throw sputtering method consists in elongating the interval between a target and a substrate under treatment thereby enabling the deposition to be implemented by exclusive use of relatively parallel sputter atom components. In the present embodiment, the operation using an interval exceeding 10 nm between the target and the substrate under treatment is thought of as conforming to the long throw sputtering method. In this case, the long throw sputtering method provides better step coverage than the ordinary sputtering method.

The means to be used for depositing the Ti-Si-N layer 14 in the first embodiment does not need to be limited to the reactive sputtering method. The collimation sputtering method or the long throw sputtering method may be adopted instead for the purpose of improving the step coverage.

The embodiments cited above each represent a case of having the groove 13 for the formation of a interconnection layer formed in the $SiO_2$ layer 12. Notwithstanding this particular illustration, the present invention can be utilized for a case of having a contact electrode embedded in a contact hole.

The embodiments cited above have been each depicted as effecting the deposition of the CVD-Cu layer 16 by adopting Cu (hfac) TMVS as a precursor therefore. This precursor, however, does not need to be limited to the Cu (hfac) TMVS. Other-precursors such as, for example, hexafluoroacetyl acetonate copper [Cu $(HFA)_2$] may be used instead.

In each of the embodiments described above, the series of steps ranging from the step of depositing the barrier layer through the step of depositing the CVD-Cu layer may be carried out continuously in a vacuum without exposing the substrate under treatment to the open air. In this case, the component reaction devices involved in the series of steps are connected with a binding chamber. By this arrangement, the interiors of these reaction devices can be prevented from the adverse effects of the oxygen or the defiling substances in the air.

This invention imparts to the ground layers 20a to 20d for the Cu layer 16 a two-ply structure using the barrier layers 14, 14a, 14c, 14d, and 14f capable of preventing diffusion of Cu and the TIN layer 15 of a low oxygen concentration capable of curtailing the incubation time. Owing to this structure, there-fore, the present invention enables a semi-conductor device using a Cu interconnection layer of low resistance to be improved in reliability and, at the same time, enhances the throughput of the relevant productional operation.

Sixth Embodiment

Figure 12A:
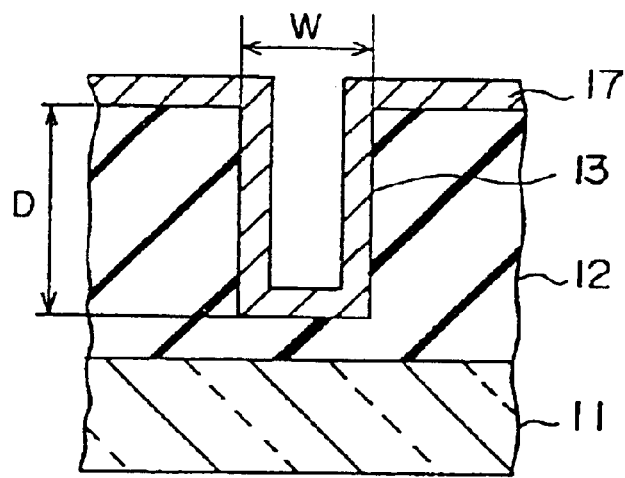
FIG. 12A to FIG. 12D are cross sections showing a process of production according to the sixth embodiment of this invention.
Figure 12B:
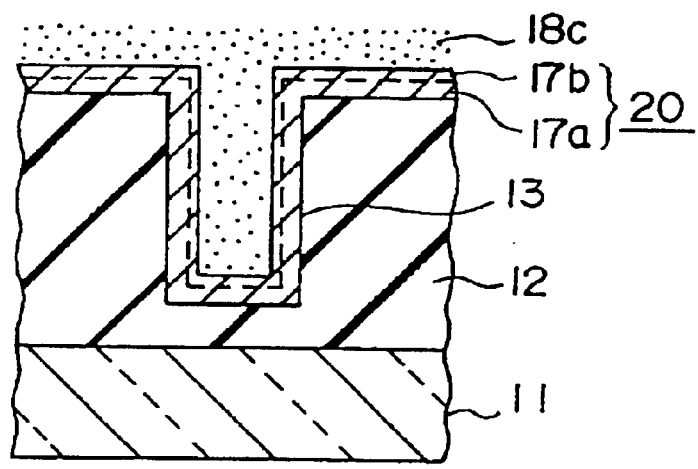

The sixth embodiment of this invention will be described below with reference to FIG. 12A to FIG. 12D. First, the $SiO_2$ layer 12 is deposited in a thickness of 600 nm by the plasma CVD method on the silicon substrate 11 having a 6-inch (about 15 cm) (100) plane 6 as a main surface thereof as shown in FIG. 12A. In this case, a TEOS (tetra-ethyl-orthosilicate)-$SiO_2$ layer or an SOG (spin-on glass) layer may be used for the $SiO_2$ layer 12. Otherwise, the $SiO_2$ layer 12 may be formed by thermally oxidizing the surface of the silicon substrate 11.

Alternatively, this $SiO_2$ layer 12 may be formed on other insulating layer such as of $Si_3N_4$ or on a metallic layer such as of TiN or W instead of being directly formed on the surface of the silicon substrate 11.

Then, a photoresist is applied thereon in a thickness of 0.6 $\mu$m. Thereafter, the $SiO_2$ layer 12 is covered with a mask of photoresist pattern formed in advance through the steps of exposure and patterning and etched along a wiring pattern 300 nm in width W and 500 nm in depth D by the use of an i ray (365 nm) to form the groove 13 as shown in FIG. 7A.

Then, a TiN film 17 having a thickness in the range of 10 to 50 nm, specifically a thickness of 50 nm, is deposited by the reactive sputtering method using a mixed gas of $Ar/N_2$. Ti is used as a target for sputtering. The flow volume ratio of $Ar/N_2$ is set in the range of 1 to 2, preferably at 1. Ar is supplied at a rate in the range of 10 to 100sccm, preferably at a rate of 50 sccm, and $N_2$ is supplied at a rate in the range of 10 to 100sccm, preferably at a rate of 50 sccm. After the deposition of the TiN film 17, the substrate is extracted from the sputtering device.

The resultant superposed layers may be annealed in an ambience of $N_2$ at a substrate temperature in the range of 300 to 600° C., specifically at 450° C. for a period in the range of 10 to 30 minutes such as, for example 30 minutes. By this annealing treatment, the trace amount of oxygen contained in the $N_2$ gas is added to the TiN film 17 and the oxygen concentration in the TiN film 17 is increased and the barrier property thereof is exalted.

Then, dimethyl hydrazine (DMH) 15 is supplied at a flow volume in the range of 10 to 200 sccm, specifically at 20 sccm to adjust the pressure in the treating chamber in the range of 10 to 100mTorrs, specifically at 20 mTorrs. The substrate temperature is kept in the range of room temperature to 500° C., specifically at 400° C., for 60 seconds to reduce the surface of the TiN film 17 and convert the surface layer thereof into a layer 17b of a low oxygen concentration. As a result, a ground layer 20e composed of an internal layer 17a of a high oxygen concentration and a surface layer 17b of a low oxygen concentration is formed.

Figure 12C:
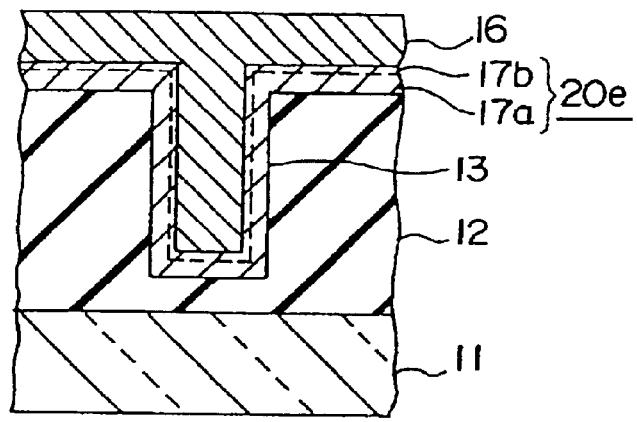

Then, the Cu layer 16 is deposited by the CVD method without exposing the TiN film 20e to the ambient air as shown in FIG. 12C. The Cu layer 16 is consequently embedded in the groove 13 and, at the same time, superposed on the ground layer 20e outside the groove 13. At this time, $H_2$ is supplied as a carrier gas at a flow volume in the range of 100 to 1000 sccm, specifically at 500 sccm and Cu (hfac) TMVS is supplied at a rate in the range of 0.020 to 2.000 g/minute, specifically at 0.165 g/minute. The pressure in the growth chamber is kept in the range of 100 to 1000 mTorrs, specifically at 200 mTorrs. The substrate temperature is kept in the range of 140 to 240° C., specifically at 160° C. for a period of about 20 minutes.

Figure 12D:
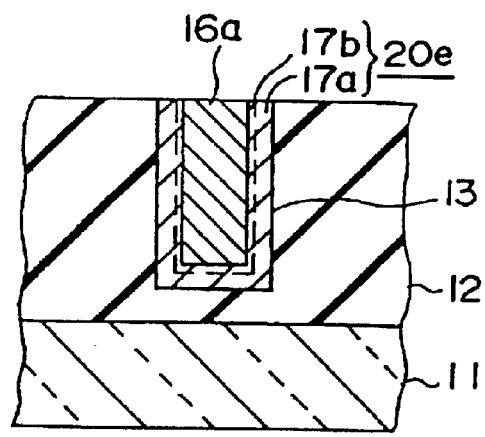

Then, the unwanted parts of the Cu layer 16 and the TiN film 20e, namely the parts of the Cu layer 16 and the TiN film 20e which rise above the height of the groove 13, are removed by the chemical mechanical polishing method using a slurry based on an alumina powder as shown in FIG. 12D. As a result, the embedded Cu interconnection layer 16a is formed in the groove 13. At this time, the polishing is performed for a period in the range of 1 to 2 minutes, with the polishing pressure kept in the range of 200 to 300 g/cm², preferably at 250 g/cm² and the rotational rate of the polisher kept in the range of 50 to 100 revolutions/minute, preferably at 50 revolutions/minute.

In the sixth embodiment described above, since the layer 17b of a low oxygen concentration is formed by reducing the surface of the TiN film 17 the incubation time involved during the growth of the Cu layer 16 shown in FIG. 12C is curtailed to a great extent and the productivity of the relevant operation is enhanced.

Since the TiN film 17 is deposited by the sputtering method, namely by the PVD method, the TiN film 20e has the layer 17a of a high oxygen concentration incorporated in the interior thereof as shown In FIG. 12D and, therefore, exhibits a perfect barrier property to Cu.

Further, the Cu interconnection layer 16a suffers a signal delay only sparingly because it has low resistivity as compared with the Al interconnection layer. It also enables a semiconductor device to enjoy improved reliability because it spends about twice as much time in fulfilling its duty before sustaining line failure due to electromigration as the Al interconnection layer.

The sixth embodiment described above has been depicted as using the TiN film 17 formed by the sputtering method as a barrier metal. Notwithstanding this particular illustration, it is allowable to use the CVD-TiN film instead. In this case, it is proper for the purpose of improving the barrier property of the TiN film 17 to interject the introduction of oxygen during the course of the CVD process and consequently heighten the oxygen concentration in the intermediate part of the TiN film 17. When the PVD-TiN film is used, it is permissible for the purpose of enhancing the barrier property thereof to effect thorough oxidation of the TiN film in an oxidizing ambience. When the surface of this thoroughly oxidized TiN film is reduced by the DMH treatment, the $N_2$ in the DMH acts to deprive the TiN film of oxygen and enrich the N content of the TiN film.

Seventh and Eighth Embodiment

Now, the method for the formation of an embedded electroconductive layer according to the seventh embodiment of this invention will be described below with reference to FIG. 13A to FIG. 13F.

Figure 13A:
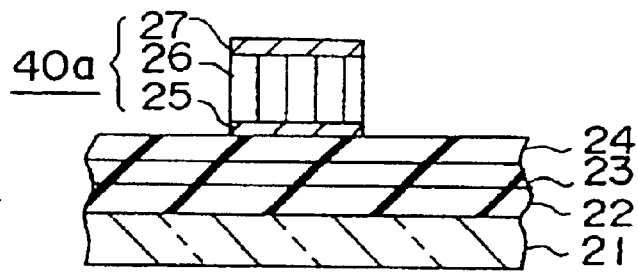
FIG. 13A to FIG. 13F are cross sections showing a process of production according to the seventh embodiment of this invention.

First, a thermally oxidized film 22 of a thickness of 200 nm is formed by thermally oxidizing a silicon substrate 21 having a 6-inch (about 15 cm) (100) plane as a main surface thereof as shown in FIG. 13A. Subsequently, a plasma TEOS-$SiO_2$ film 23 of a thickness of 200 nm and an SOG-$SiO_2$ film 24 of a thickness of 300 nm are sequentially deposited in the order mentioned on the thermally oxidized film 22.

Then, a TiN film 25 of a thickness of 100 nm, an AlCuTi film 26 of a thickness of 600 nm, and a TiN film 27 of a thickness of 100 nm are deposited by the sputtering method. Subsequently, a lower interconnection layer 40a of a three-ply structure is formed by patterning the films mentioned above.

The proportions of Cu and Ti in the AlCuTi film 26 are respectively 1.0% by weight and not more than 1.0% by weight.

Figure 13B:
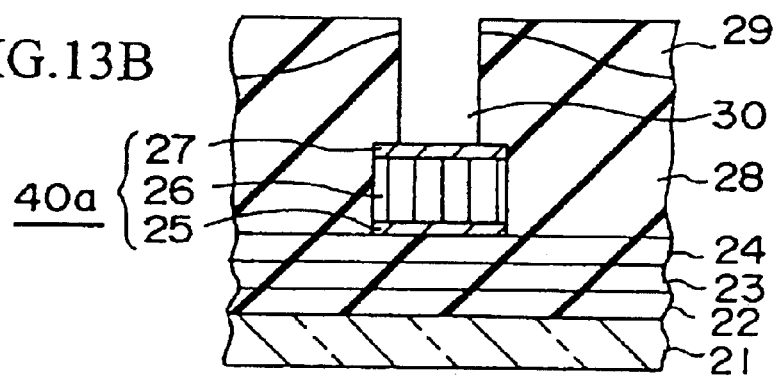

Then, a TEOS-$SiO_2$ film 28 is formed by the plasma CVD method using TEOS so as to have a thickness of 900 nm above the lower interconnection layer 40a as shown in FIG. 13B. Subsequently, an SOG-$SiO_2$ film 29 is formed so as to have a thickness of 100 nm above the lower Interconnection layer 40a and give rise to a flat surface.

Then, a contact hole 30 measuring 500 nm in diameter and 1000 nm in depth and reaching the lower interconnection layer 40a is formed by etching the SOG-$SiO_2$ film 29 and the TEOS-$SiO_2$ film 28.

Figure 13C:
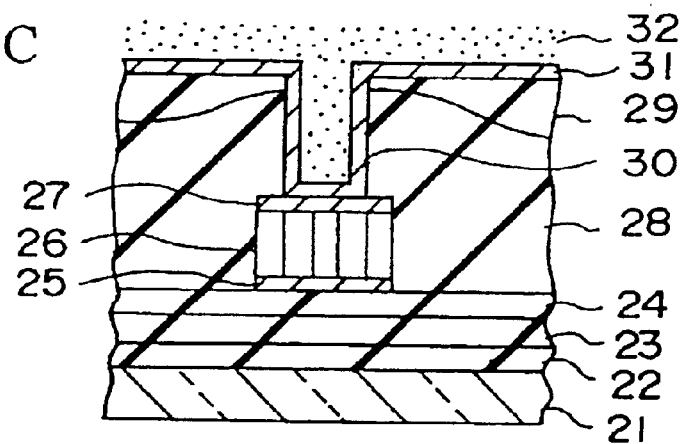

Then, $TiCl_4$ is supplied at a flow volume in the range of 10 to 20 sccm, specifically 10 sccm, He at a flow volume in the range of 40 to 80 sccm, specifically 50 sccm, monomethyl hydrazine at a flow volume in the range of 0.4 to 0.8 sccm, specifically 0.7 sccm, and $NH_3$ at a flow volume in the range of 400 to 800 sccm, specifically 500 sccm as shown in FIG. 13C. The pressure in the growth chamber is kept in the range of 50 to 200 mTorrs, specifically at 100 mTorrs. The substrate temperature is kept in the range of 500 to 600° C., specifically at 600° C. for a period of 100 seconds. As a result, a CVD-TiN film 31 is deposited in a thickness in the range of 10 to 50 nm, specifically 50 nm.

Then, DMH 32 is supplied at a flow volume in the range of 10 to 200 sccm, specifically 20 sccm and the pressure in the treating chamber is adjusted in the range of 10 to 100 mTorrs, specifically at 20 mTorrs. By keeping the substrate temperature in the range of room temperature −500° C., specifically at 400° C., for a period of 60 seconds the surface of the CVD-TiN film 31 is reduced.

Figure 13D:
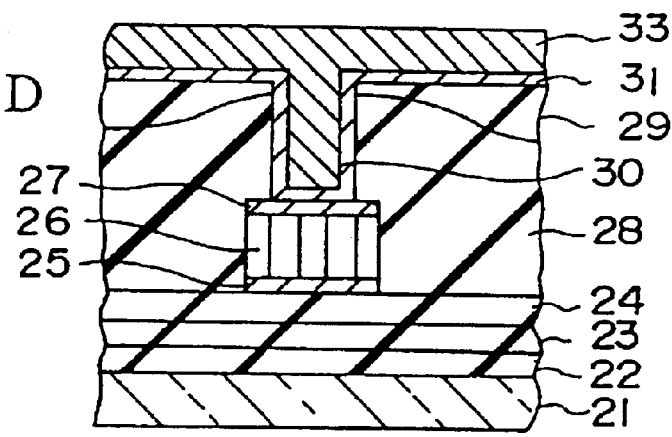

Then, a Cu layer 33 is deposited by the CVD method as shown in FIG. 13D without exposing the CVD-TiN film 31 to the ambient air. As a result, the Cu layer 33 is embedded in the contact hole 30. At this time, $H_2$ is supplied as a carrier gas at a flow volume in the range of 100 to 1000 sccm, specifically 500 sccm and Cu (hfac) TMVS is additionally supplied at a rate in the range of 0.020 to 2.000 g/minute, specifically 0.165 g/minute. The pressure in the growth chamber is kept in the range of 100 to 1000 mTorrs, specifically 25 at 200 mTorrs. The substrate temperature is kept in the range of 140 to 240° C. specifically at 160° C., for a period of about 20 minutes.

Figure 13E:
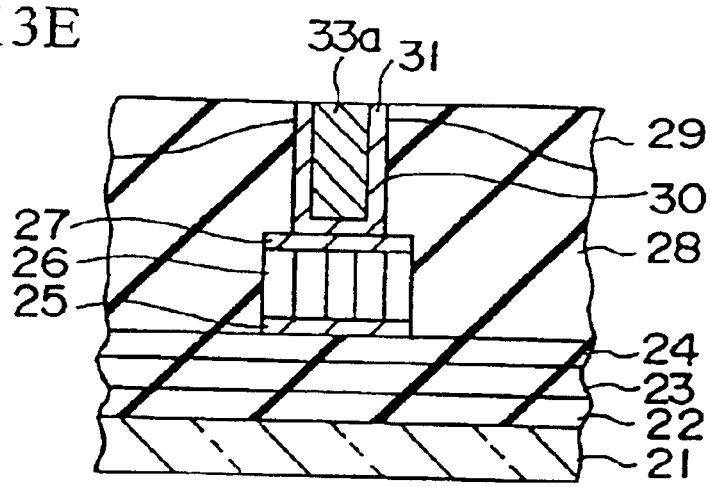

Then, the unwanted parts of the Cu layer 33 and the CVD-TiN film 31, namely the parts of the Cu layer 33 and the CVD-TiN film 31 rising above the height of the contact hole 30, are removed by the chemical mechanical polishing method using a slurry based on an alumina powder as shown in FIG. 13E. As a result, an embedded Cu layer or a plug is formed in the contact hole 30. At this time, the polishing is performed for a period in the range of 1 to 2 minutes, with the polishing pressure kept in the range of 200 to 300 g/cm$^2$, preferably at 250 g/cm$^2$ and the rotational rate of the polisher kept in the range of 50 to 100 revolutions/minute, preferably at 50 revolutions/minute.

Figure 13F:
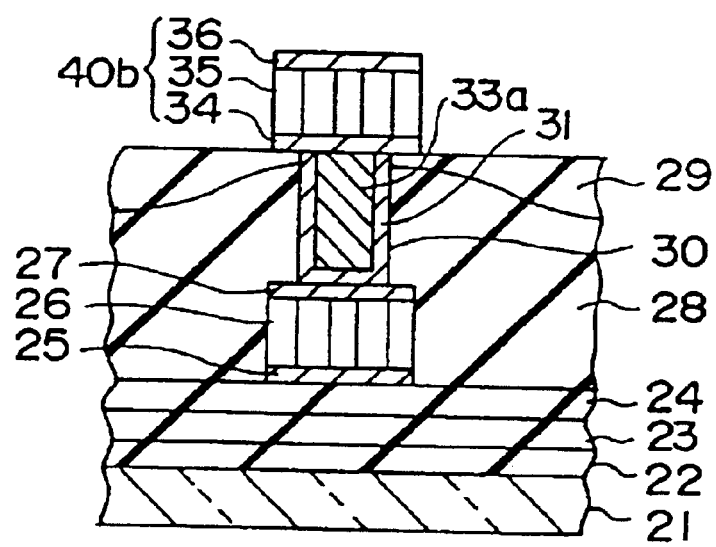

Then, a TiN film 34 of a thickness of 100 nm, an AlCuTi film 35 of a thickness of 60 nm, and a TIN film 36 of a thickness of 100 nm are deposited by the sputtering method in the same manner as the lower interconnection layer 40a as shown in FIG. 13F. By having these films patterned subsequently, an upper interconnection layer 40b of a three-ply structure is formed An increase in the number of plies of the structure is attained by simply repeating the step mentioned above as many times as the additional plies.

In the seventh embodiment, since the CVD-TiN film 31 is used as a barrier metal layer, the surface oxidized film is thin as compared with the PVD-TIN film, the reduced TIN film containing no oxygen can be easily obtained, and the incubation time can be curtailed.

This situation will be described below with reference to FIG. 14A and FIG. 14B.

Figure 14A:
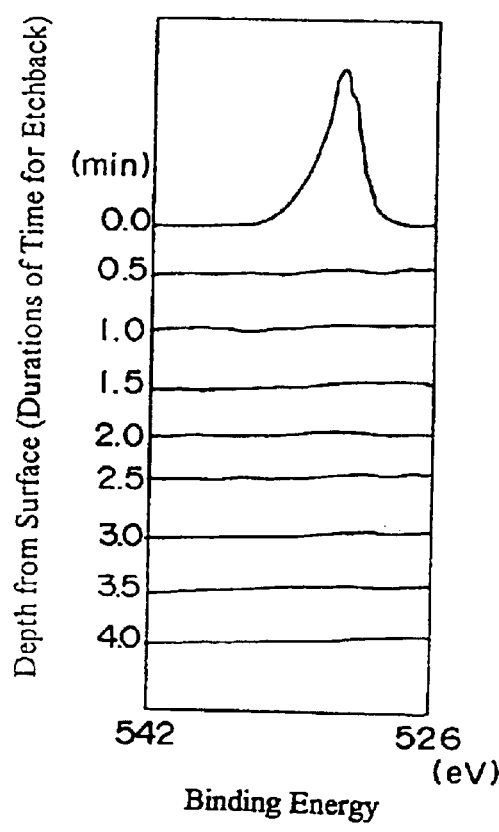
FIG. 14A and FIG. 14B are diagrams showing a difference in the oxygen content in a TIN film due to a difference in the method of production.
Figure 14B:
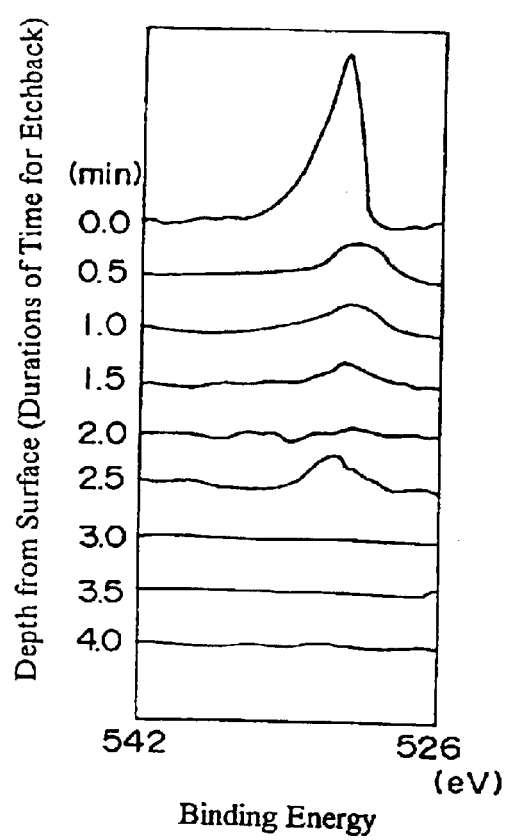

FIG. 14A and FIG. 14B show the results of the determination of oxygen concentration in the CVD-TiN layer and the PVD-TIN layer effected by measuring the bond energy originating in the Is electron orbit of oxygen in the layer. The results indicate that a high oxygen concentration is detected only in the surface part of the CVD-TIN film.

In the seventh embodiment, since the barrier property to Cu is retained by the TiN film 27 of the lower interconnection layer 40a and the TiN film 34 of the upper interconnection layer 40b, the CVD-TIN film 31 does not require the barrier property of itself very much and, therefore, the use of the CVD-TIN film is allowed.

Figure 15:
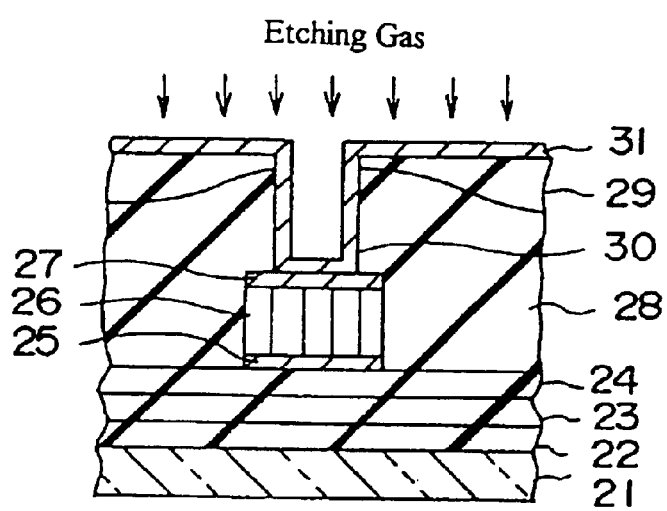
FIG. 15 is a cross section showing part of a process of production according to the eighth embodiment of this invention.

The CVD-TIN film 31 has a layer of a high oxygen concentration only in the surface region thereof. In the same manner as in the eighth embodiment shown in FIG. 15, therefore, the layer of a high oxygen concentration in the surface region can be removed by the etching treatment instead of the reducing treatment shown in FIG. 13C so as to curtail the incubation time. In this case, the etching gas to be used may be any member selected from among $ClF_3$, $NF_3$, and $BCl_3$. This etching gas may be used as converted into a plasma. Otherwise, activated seeds which are generated by the thermal decomposition of the etching gas may be used. In the other respects, the construction is the same as that utilizing the reducing treatment.

In the sixth and the seventh embodiment, the incubation time is curtailed and the throughput in the relevant productional operation is improved because the reducing treatment of the surface layer of the substrate layer or the removal of the surface layer of a high oxygen concentration from the ground layer is carried out while the Cu layer is deposited by the CVD method as described above.

Unlike the first through the fifth embodiment, the sixth and the seventh embodiment avoid using the two-ply film consisting of the barrier metal layer and the CVD-TiN film as the ground layer and they further avoid giving a special treatment to the barrier metal layer constituting the ground layer. Thus, the process of production is simplified and the throughput is enhanced.

In the sixth and the seventh embodiment described above, the DMH treatment is carried out at 400° C. and the subsequent growth of Cu is carried out after the temperature has fallen to 140° C. or to 160° C. Otherwise, the DMH treatment may be carried out at a low temperature, specifically at a temperature intermediate between room temperature and the temperature for starting the growth of Cu. Thereafter, the growth of Cu may be implemented in the same reaction chamber as is used for the DMH treatment.

The reducing treatment is effected by the use of DMH. The medium for the reducing treatment does not need to be limited to DAMN. Monomethyl hydrazine (MMH) may be used instead. Such silanes as $SiH_4$ and $Si_2H_4$ are also usable. When a silane is used, it is preferable to perform the treatment at a fairly low temperature because the silane at a high temperature reacts to form an amorphous Ti-Si-Ti film.

Further, the two embodiments contemplate using Cu (hfac) TMVS as a precursor for the Cu layers 16 and 33 to be deposited. The precursor does not need to be limited to Cu (hfac) TMVS. It is permissible to use other precursors such as, for example, hexafluoroacetyl acetonate-Cu:Cu $(HFA)_2$ instead.

They contemplate using monomethyl hydrazine (MMH) as the N source at the step of depositing the CVD-TiN film. It is permissible to use dimethyl hydrazine (DMH) instead.

They further contemplate using Cu, a substance excelling in resistance to electromigration, as the material for the embedded electroconductive layer. From the viewpoint of imparting a flat smooth surface to the interconnection layer, however, it is proper to use Al or an Al alloy having Al as a main component as the material for the conductive layer.

In the case of the Al interconnection layer, such an Al metal compound as dimethyl aluminum hydride (DMAH) is used as the precursor for the layer.

When the Al alloy interconnection layer such as, for example, an Al-Cu alloy layer is used, it is permissible for the purpose of exalting the resistance of the Al embedded electroconductive layer to electromigration to use DMAH and Cu (hfac) TMVS simultaneously as precursors and consequently form an embedded electroconductive layer of an al-cu alloy having a Cu content of not more than 1% by weight.

What is claimed is:

1. An embedded electroconductive layer comprising:
   an opening part or a depressed part formed in an insulating film on a substrate;
   a barrier layer covering said opening part or said depressed part;
   a metal growth promoting layer formed directly on said barrier layer, said metal growth promoting layer being made of a refractory metal nitride different from a material of said barrier layer, and
   an electroconductive layer embedded in said opening part or said depressed part via said barrier layer and said metal growth promoting layer, said electroconductive layer being formed of a Cu layer, an Al layer or an Al alloy having Al as a main component thereof, and said electroconductive layer being formed on and in contact with said metal growth promoting layer;
   wherein said metal growth promoting layer is a TiN layer containing oxygen at a lower concentration than said barrier layer.

2. The embedded electroconductive layer according to claim 1, wherein a material of said barrier layer is $WN_x$, where x is a variable such that 0<x<1.

3. The embedded electroconductive layer according to claim 1, wherein a material of said barrier layer is $TaN_x$, where x is a variable such that 0<x<1.

4. The embedded electroconductive layer according to claim 1, wherein a material of said barrier layer is amorphous TiSiN.

5. The embedded electroconductive layer according to claim 1, wherein a material of said barrier layer is $Al_2O_3$.

6. The embedded electroconductive layer according to claim 1, wherein said metal growth promoting layer is a TiN layer formed by a chemical vapor deposition (CVD) process.

7. An embedded electroconductive layer comprising:
   an opening part or a depressed part formed in an insulating layer on a substrate;
   a ground layer made of TiN containing oxygen at a high concentration in the lower part thereof and at a low concentration in the upper part thereof, and said ground layer covering the surface of said insulating layer in said opening part or said depressed part; and
   an electroconductive layer embedded in said opening part or said depressed part via said ground layer said electroconductive layer being formed of a Cu layer, an Al layer, or an Al alloy layer having Al as a main component thereof, and said electroconductive layer being formed on said ground layer and in contact with said upper part of said sound layer.

* * * * *

UNITED STATES PATENT AND TRADEMARK OFFICE
CERTIFICATE OF CORRECTION

PATENT NO. : 6,891,269 B1
DATED : May 10, 2005
INVENTOR(S) : Shigeru Okamoto

It is certified that error appears in the above-identified patent and that said Letters Patent is hereby corrected as shown below:

<u>Column 16,</u>
Lines 28 and 31, delete "0<x<1" and insert -- $0 \leq x \leq 1$ -- therefore.
Line 55, delete "said sound layer" and insert -- said ground layer -- therefore.

Signed and Sealed this

Twenty-third Day of August, 2005

JON W. DUDAS
*Director of the United States Patent and Trademark Office*

UNITED STATES PATENT AND TRADEMARK OFFICE
CERTIFICATE OF CORRECTION

PATENT NO. : 6,891,269 B1  Page 1 of 1
DATED : May 10, 2005
INVENTOR(S) : Shigeru Okamoto It is certified that error appears in the above-identified patent and that said Letters Patent is hereby corrected as shown below:

<u>Title page,</u>
Item [73], Assignee, delete "Fujitsu LImited" and insert -- Fujitsu Limited --.

Signed and Sealed this

Thirteenth Day of June, 2006

JON W. DUDAS
*Director of the United States Patent and Trademark Office*